(12) United States Patent
Takayanagi

(10) Patent No.: US 7,177,201 B1
(45) Date of Patent: Feb. 13, 2007

(54) NEGATIVE BIAS TEMPERATURE INSTABILITY (NBTI) PRECONDITIONING OF MATCHED DEVICES

(75) Inventor: Toshinari Takayanagi, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 106 days.

(21) Appl. No.: 10/664,104

(22) Filed: Sep. 17, 2003

(51) Int. Cl.
*G11C 7/00* (2006.01)

(52) U.S. Cl. .................. 365/189.01; 365/163; 365/196

(58) Field of Classification Search ........... 365/189.01, 365/189.09, 201, 196, 207
See application file for complete search history.

(56) References Cited

U.S. PATENT DOCUMENTS

| | | | |
|---|---|---|---|
| 3,838,295 A | 9/1974 | Lindell | |
| 5,248,946 A | 9/1993 | Murakami et al. | |
| 5,414,663 A * | 5/1995 | Komarek et al. | 365/210 |
| 5,515,310 A * | 5/1996 | Winters | 365/49 |
| 5,525,919 A | 6/1996 | Phelan | |
| 5,539,700 A | 7/1996 | Kawahara et al. | |
| 5,627,457 A * | 5/1997 | Ishiyama et al. | 323/318 |
| 5,638,333 A | 6/1997 | Lee | |
| 5,650,979 A * | 7/1997 | Komarek et al. | 365/233.5 |
| 5,696,726 A | 12/1997 | Tsukikawa | |
| 5,710,737 A | 1/1998 | Komiya et al. | |
| 5,731,716 A * | 3/1998 | Pascucci | 365/200 |
| 5,764,178 A | 6/1998 | Kim | |
| 5,796,993 A | 8/1998 | Maguire | |
| 5,894,233 A | 4/1999 | Yoon | |
| 5,982,693 A | 11/1999 | Nguyen | |
| 6,005,824 A | 12/1999 | Crafts | |
| 6,038,181 A | 3/2000 | Braceras et al. | |
| 6,038,195 A | 3/2000 | Farmwald et al. | |
| 6,041,419 A | 3/2000 | Huang et al. | |
| 6,072,733 A | 6/2000 | Advani | |
| 6,101,141 A | 8/2000 | Schöniger et al. | |
| 6,111,796 A | 8/2000 | Chang et al. | |
| 6,154,064 A | 11/2000 | Proebsting | |
| 6,185,712 B1 | 2/2001 | Kirihata et al. | |
| 6,285,611 B1 | 9/2001 | Kang | |
| 6,288,950 B1 | 9/2001 | Koike | |
| 6,329,857 B1 | 12/2001 | Fletcher | |

(Continued)

FOREIGN PATENT DOCUMENTS

FR 2 792 760 10/2000

*Primary Examiner*—Thong Q. Le
(74) *Attorney, Agent, or Firm*—Dorsey & Whitney LLP (57) ABSTRACT

An accumulated data-dependent post-manufacture shift in a characteristic of one or more of a pair of matched devices within an integrated circuit may cause a mismatch in the characteristic between the pair of matched devices. This mismatch may be reduced by preconditioning the matched devices to cause an initial shift in the characteristic in each of the matched devices and to thereby reduce an expected magnitude of any further lifetime shift in the characteristic of either matched device. In an exemplary sense amplifier circuit having matched cross-coupled PMOS load devices, a data dependent threshold mismatch between the PMOS devices resulting from a Negative Bias Temperature Instability (NBTI) effect may be reduced by biasing both of the matched PMOS devices so that both experience an initial NBTI Vt shift, and so that any expected further Vt shift in either device over the product lifetime is reduced. Consequently the amount of threshold mismatch that may subsequently develop over the product lifetime is likewise reduced.

58 Claims, 8 Drawing Sheets

U.S. PATENT DOCUMENTS

| | | |
|---|---|---|
| 6,359,816 B1 | 3/2002 | Nurser |
| 6,442,644 B1 | 8/2002 | Gustavson et al. |
| 6,462,998 B1 | 10/2002 | Proebsting |
| 6,470,467 B2 | 10/2002 | Tomishima et al. |
| 6,480,037 B1 | 11/2002 | Song et al. |
| 6,531,931 B1 | 3/2003 | Benyamin et al. |
| 6,574,160 B1 * | 6/2003 | Eleyan et al. ............... 365/207 |
| 6,642,746 B2 | 11/2003 | Donnelly et al. |
| 6,643,164 B2 | 11/2003 | Laurent |
| 6,650,580 B1 * | 11/2003 | Braceras ............... 365/201 |
| 6,717,877 B2 | 4/2004 | Suzuki et al. |
| 6,756,841 B2 | 6/2004 | Jaussi et al. |
| 6,762,961 B2 * | 7/2004 | Eleyan et al. ............... 365/194 |
| 6,967,506 B2 | 11/2005 | Roger |
| 2003/0198112 A1 * | 10/2003 | Eleyan et al. ............... 365/205 |

* cited by examiner

NEGATIVE BIAS TEMPERATURE INSTABILITY (NBTI) PRECONDITIONING OF MATCHED DEVICES

CROSS-REFERENCE TO RELATED APPLICATION(S)

This application is related to co-pending U.S. application Ser. No. 10/664,121 by Toshinari Takayanagi, entitled "Negative Bias Temperature Instability (NBTI) Hardened Sense Amplifier Circuit and Method Therefor," filed on even date herewith, which application is hereby incorporated by reference in its entirety.

FIELD OF THE INVENTION

The present invention relates generally to integrated circuits having matched devices and, more particularly, to sensing circuits in an integrated circuit configuration susceptible to data-dependent creep in device characteristics.

BACKGROUND

Typically, modern semiconductor memories (whether embodied in a memory integrated circuit or incorporated in a larger design, e.g., as cache memory of a processor integrate circuit) employ differential bit lines and some sort of differential amplifier or sensing circuit in their design. Such differential amplifier and sensing circuits are commonly known as sense amplifiers (sense amps) and a wide variety of sense amp designs are known in the art, including current sensing and voltage sensing variations.

Generally, when designing memory sense amps, great care is taken to balance the sense amps to reduce any offset voltage. Such balancing usually involves careful layout of the devices to ensure that matched devices are oriented identically and vary identically with mask layer misalignment, in order to achieve nearly identical device characteristics, such as mobility, threshold voltage, and overlap capacitances when fabricated. Certainly other attention is customarily directed to careful layout of the source/drain regions and interconnections in order to achieve nearly identical nodal capacitances and inter-conductor capacitances, which also help reduce sense amplifier offsets.

Unfortunately, even if devices are well matched as fabricated, one or more devices may experience a shift in one or more parameters over a long period of time. In certain very-small device technologies, data-dependent effects have begun to present themselves. One such effect is Negative Bias Temperature Instability (NBTI). Accordingly, new techniques are desired to address NBTI and other similar or related effects.

SUMMARY

It has been discovered that new methods and circuit configurations may be employed to address data-dependent degradation or creep in device characteristics affecting a circuit having matched devices such as, for example, a differential sense amplifier. One particular example of such data-dependent degradation or creep involves Negative Bias Temperature Instability (NBTI), which can cause the threshold voltage of a PMOS device to shift by as much as 50–100 mV after several years of cumulative stress by a negative gate bias voltage at elevated temperatures. In certain circuit configurations, NBTI can cause the threshold voltage (Vt or $V_t$) of PMOS devices to increase by an amount that depends on the historical amount of voltage bias that has been applied across the gate and source nodes. In the case of many sense amplifier designs, a predominance of one value read out using the sense amp may tend to disparately affect one matched device (or set of devices) as compared with the other matched device (or set of devices). In other words, in certain exemplary memory sense amplifier circuits, if the same data value is read over and over again, then one of two matched PMOS devices of the sense amp will accumulate an NBTI-related $V_t$ shift, while the other matched (i.e., opposing) PMOS device will accumulate little or no shift. The accumulated mismatch tends to cause an increase in the sense amp offset and thus degrade performance.

An accumulated data-dependent post-manufacture shift in a characteristic of one or more of a pair of matched devices within an integrated circuit, which shift gives rise to a mismatch in the characteristic between the pair of matched devices, may be compensated for by preconditioning the matched devices to cause an initial shift in the characteristic in each of the matched devices and to thereby reduce an expected magnitude of any further lifetime shift in the characteristic of either matched device.

In the exemplary sense amplifier described above, the mismatch may be compensated for by preconditioning both of the matched PMOS devices so that both matched devices experience an initial Vt shift, and so that any expected further Vt shift in either device over the product lifetime is reduced. As a consequence, the amount of threshold mismatch between the two matched PMOS devices that may subsequently develop over the product lifetime is likewise reduced.

Preferably the matched devices are preconditioned in a suitable manner to cause the respective initial shift in each of the matched devices to be substantially equal. In some embodiments, the respective initial shift in the characteristic in each of the matched devices is greater than the an expected magnitude of any remaining lifetime shift in the characteristic of either matched device.

A preferred preconditioning step may include subjecting each of the matched pair of devices to substantially equal time durations of a predetermined bias condition known to promote the shift in the characteristic. The preconditioning may be carried out at an elevated temperature to promote the shift in the characteristic. In certain embodiments the preconditioning step includes subjecting the matched pair of devices to substantially equal time durations of a first bias condition corresponding to one data state as a second bias condition corresponding to another data state opposite the one data state. In other embodiments the preconditioning step includes subjecting both matched devices simultaneously to the predetermined bias condition. In various embodiments the preconditioning step may be performed during a burn-in operation.

The matched devices may include field effect transistors, and may include other devices. The predetermined bias condition may include a negative gate-to-source voltage. In certain embodiments the matched devices may form part of a sense amplifier circuit. For example, in some sense amplifiers the matched devices may be PMOS devices, which, for some embodiments, may function as load devices for the sense amplifier.

In some embodiments the preconditioning step may be carried out at an elevated temperature and for a period of time sufficient to cause a respective initial shift in each of the matched devices which are substantially equal in magnitude and greater than the an expected magnitude of any remaining lifetime shift in the characteristic of either matched device.

In some embodiments the matched devices form a portion of a sensing circuit of a semiconductor memory, and the at least one characteristic susceptible to an accumulated data-dependent mismatch results, at least in part, from an effect that disparately affects one of the pair of matched devices as compared with the other, the disparate effect based on a skew in a history of values read out from associated memory elements. The disparate effect may be associated with negative bias temperature instability. The disparate effect may involve a monotonic change in the characteristic based on disparate voltage bias histories of the matched devices. The characteristic may be mobility, threshold voltage ($V_t$), or some other parameter.

In some embodiments the pair of matched devices are PMOS transistors, the characteristic is threshold voltage ($V_t$), and the disparate effect is associated with negative bias temperature instability and results in a monotonic increase in $V_t$ based on disparate voltage bias histories of the PMOS transistor devices. For some embodiments such matched devices include cross-coupled PMOS load devices.

In one embodiment of the invention a circuit includes first and second matched devices which are susceptible to an accumulated data-dependent post-manufacture shift in a characteristic of one or more of the matched devices. The shift gives rise to a mismatch in the characteristic between the matched devices. The circuit also includes a preconditioning circuit for subjecting the matched devices to a particular condition for a length of time sufficient to cause an initial shift in the characteristic in each of the matched devices and to thereby reduce an expected magnitude of any further lifetime shift in the characteristic of either matched device.

The invention in several aspects is particularly suitable for implementation within an integrated circuit, including those integrated circuits having a memory array, for methods for operating such integrated circuits, and for computer readable media encodings of such integrated circuits, all as described herein in greater detail and as set forth in the appended claims. A wide variety of such integrated circuits is specifically contemplated, including those having a processor and a memory array.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The description herein focuses on an illustrative set of sense amplifier circuits and devices, namely PMOS devices thereof, for which a particular source of disparate post-manufacture creep in characteristics is discussed. In particular, the description focuses on negative bias temperature instability-based (NBTI-related) $V_t$ shift based on disparate bias histories of cross-coupled PMOS devices of a sense amplifier within a memory circuit. While the particular data-dependent effect illustrated represents an important source of disparity for which techniques of the present invention are well adapted, the invention is not necessarily limited thereto. Indeed, based on the description herein, persons of ordinary skill in the art will appreciate applications to other sources of device mismatch developed post-manufacture in differential circuits or in other circuits utilizing matched devices. Other effects may include channel hot carrier or tunneling-related effects that disparately affect susceptible configurations of devices, as well as variations in device mobility.

While the NBTI-related $V_t$ shift is generally monotonic, other effects need not be so and may decay over time. Similarly, disparities in device characteristics may grow or diminish based the particular bias or data histories experienced by a susceptible configuration of matched devices. Given a particular disparate effect on matched devices, circuit compensation techniques described herein may be employed or adapted to improve performance. Based on the description herein, persons of skill in the art will appreciate suitable variations on the described techniques for other susceptible circuit configurations and effects. Accordingly, in view of the foregoing, and without limitation, illustrative sense amplifier circuits susceptible to NBTI-related $V_t$ shift in cross-coupled PMOS devices thereof and suitable compensation techniques are now described.

Figure 1:
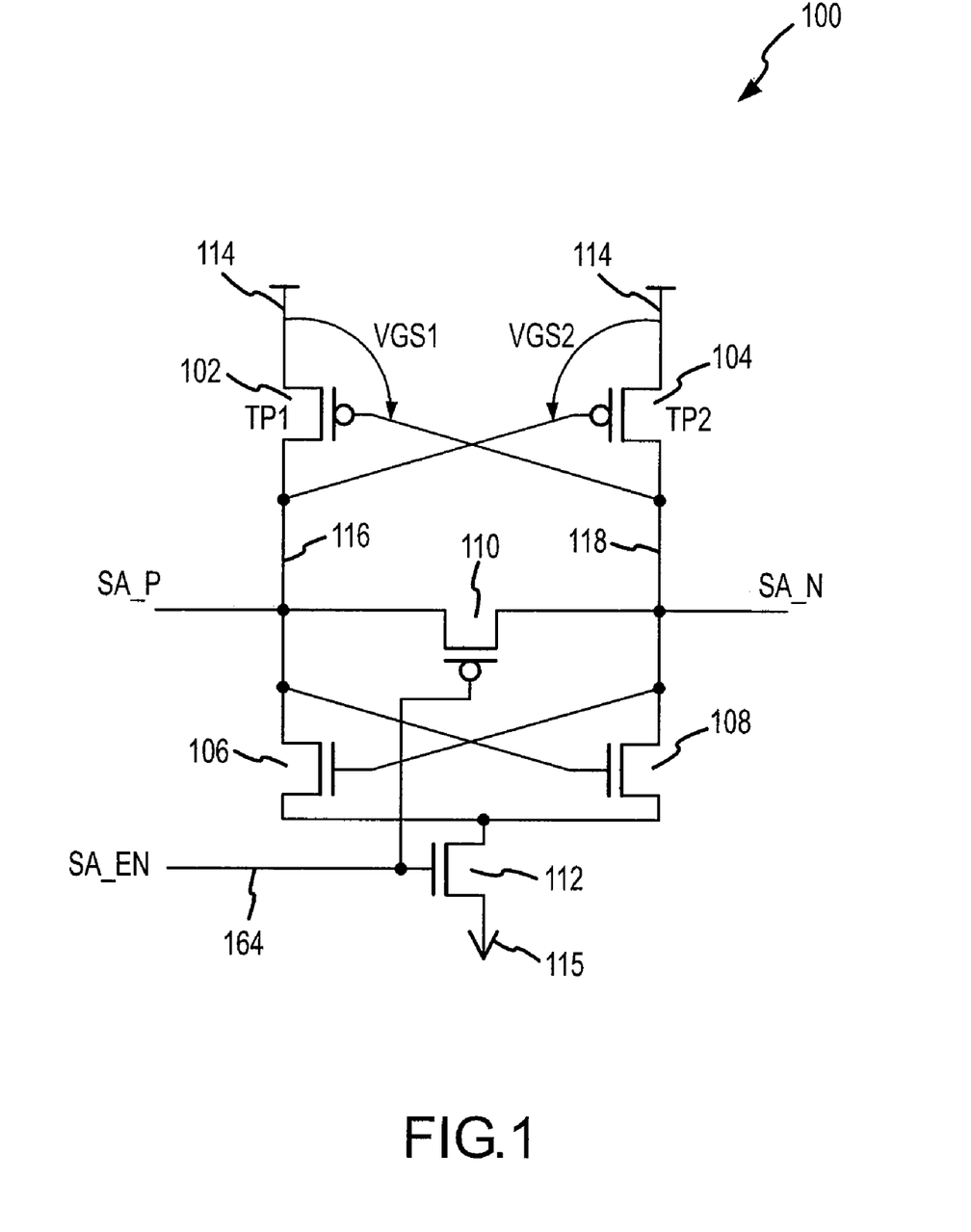
FIG. 1 depicts an illustrative sense amplifier circuit in which cross-coupled PMOS devices may be affected by disparate data-dependent voltage bias histories.

Referring now to FIG. 1, an illustrative sense amplifier circuit 100 is depicted, which includes a pair of cross coupled PMOS load devices TP1, TP2 (also labeled, respectively, as 102, 104) which are coupled to a voltage terminal 114, such as a VDD power supply bus. Transistors 102, 104 may also be known as a cross-coupled PMOS transistor pair. Such a VDD power supply bus may operably be coupled to receive a voltage of, for example, 2–3 volts. The sense amplifier nodes 116, 118 are equilibrated together by PMOS device 110 when the SA_EN signal conveyed on node 164 is inactive (i.e., in this case, low). The PMOS equilibration, or precharge, device 110 ensures that the internal sense amplifier nodes 116, 118 are equilibrated between cycles. A cross-coupled pair of NMOS devices 106, 108 forms an amplification circuit having a common source node which is driven to ground through device 112 when the SA_EN signal transitions to a high level, to amplify an initial voltage differential between the SA_P and SA_N nodes. The source of transistor 112 may be coupled to a voltage terminal 115, such as a ground bus (i.e., VSS bus) or some other more-negative voltage bus.

For the purposes of description, assume that voltage terminal 114 is coupled to VDD, and that voltage terminal 115 is coupled to ground. In typical operation, the sense amplifier 100 is steered to cause one of either the SA_P node 116 or the SA_N node 118 to fall toward ground, and the other node to remain at, or be driven to, VDD. If the data being read is a polarity such that the SA_P node 116 is driven to ground, and the SA_N node 118 remains at VDD, then the gate-to-source voltage $V_{GS2}$ developed across the transistor TP2 will be a large negative voltage (i.e., the source node remains at VDD, while the gate node 116 is at ground), whereas the gate-to-source voltage $V_{GS1}$ developed across the transistor TP1 will be near zero (i.e., the source node remains at VDD, and the gate node 118 is driven to VDD). Thus, the bias conditions on each of the cross-coupled PMOS load devices is data-dependent.

Figure 2:
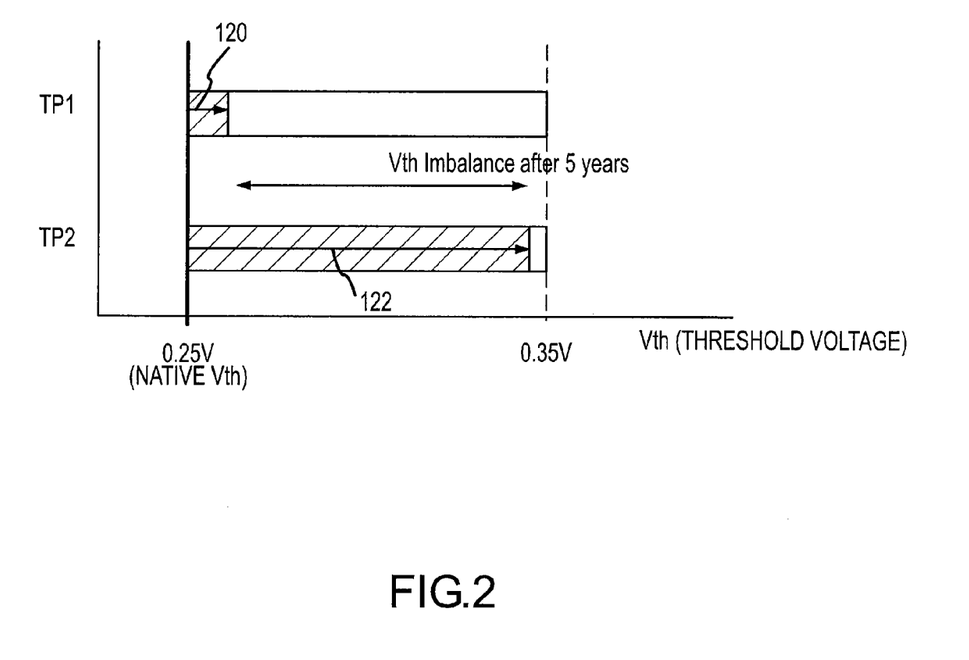
FIG. 2 depicts a graph showing a threshold voltage imbalance, or mismatch, which can develop between two matched devices as a result of disparate data-dependent voltage bias histories.

Negative bias temperature instability (NBTI) effects can cause the respective threshold voltage ($V_t$) of PMOS devices TP1 and TP2 to increase by an amount that depends on the historical amount of voltage bias that has been applied between the gate and source nodes (i.e., gate-source bias). Referring now to FIG. 2, the shift in threshold voltage may reach 50–100 mV after operation over a period of several years, particularly at an elevated temperature. For example, transistors TP1, TP2 may be fabricated to have a native threshold voltage of 0.25 V, but this threshold voltage may shift during operation (e.g., post-manufacture) to as much as 0.35 V if the transistor is subjected to a high incidence of negative gate bias. Given NBTI effects, a predominance of one data value read out using sense amp 100 will tend to disparately affect one of the PMOS devices as compared with the opposing device. In other words, if the same data value is read over and over again using sense amp 100, then one of the two cross-coupled PMOS devices (e.g., transistor TP2) will accumulate an NBTI-related $V_t$ shift (labeled as 122), while the opposing PMOS device (e.g., transistor TP1) will accumulate little or no shift (labeled as 120). The accumulated mismatch tends to cause an increase in the offset voltage of the sense amplifier 100, and deleteriously affects the ability of the sense amp to reliably read data from a corresponding memory cell.

In the exemplary circuit described, the potential $V_t$ imbalance between cross-coupled PMOS devices TP1, TP2 which may develop over time may be reduced by applying NBTI bias conditions to intentionally shift the threshold voltage of each device TP1, TP2. Such NBTI effects are frequently monotonic, and the shifted threshold voltage tends to saturate at a final value. By accomplishing a portion of this ultimate shift during this intentional shift period, the amount by which the threshold voltage of either device can shift during the remaining device lifetime is that much reduced. Consequently, even if a data-dependent mismatch occurs over the product lifetime, the maximum imbalance is reduced. Preferably such preconditioning occurs during a burn-in operation because the elevated temperature during burn-in accelerates the NBTI effect.

Figure 3:
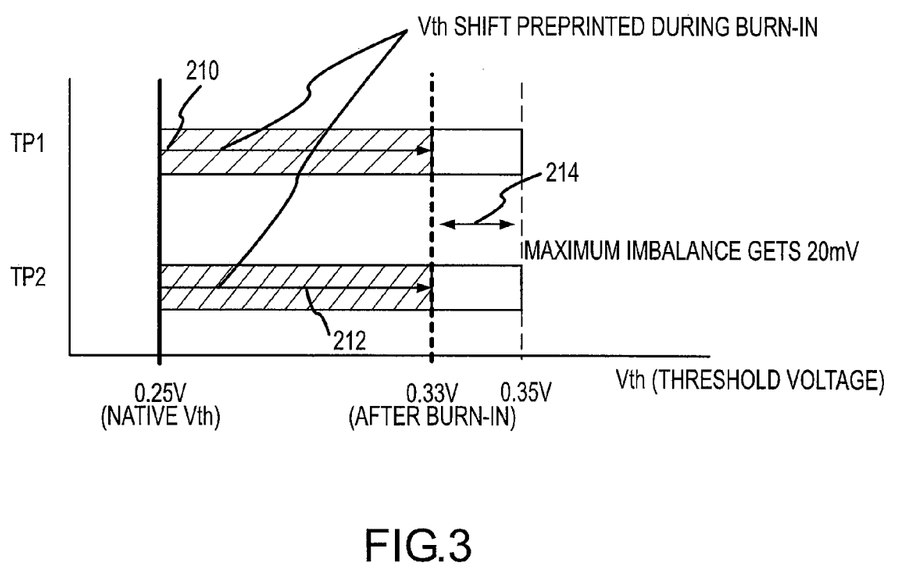
FIG. 3 depicts a graph showing an intentional threshold voltage shift achieved by preconditioning matched devices, and which reduces the maximum imbalance likely to develop between the two matched devices as a result of disparate data-dependent voltage bias histories over the lifetime of the devices.

The result of such preconditioning may be seen in FIG. 3 when contrasted to FIG. 2. Devices TP1, TP2 are biased so that NBTI effects cause the respective threshold voltage to shift from a native value of 0.25 V to a preconditioned (i.e., "pre-printed") value of 0.33 V, as depicted by labeled shifts 210 and 212, respectively. As a result, the maximum amount of any additional threshold shift which may occur in either device during the product lifetime is reduced from approximately 100 mV to approximately 20 mV. Consequently, the maximum threshold imbalance between the two matched devices TP1, TP2 is likewise reduced from approximately 100 mV to approximately 20 mV, even if a particular data pattern is experienced by the sense amplifier which tends to expose one of the devices to much greater NBTI effects than the other.

Any amount of threshold shift which is accomplished during such a pre-printing operation will reduce the maximum imbalance which may develop over additional time, although preferably the intentional threshold shift is larger in magnitude than any remaining expected threshold shift (e.g., the case depicted in FIG. 3). Moreover, it is preferable to apply uniform bias conditions to both devices so that the intentional threshold shift in each of the matched devices is well matched, although a pre-printing operation that shifted the threshold of TP1 to 330 mV but only shifted the threshold of TP2 to 320 mV nonetheless accomplishes a reduction in the potential lifetime threshold imbalance from 100 mV down to 30 mV.

Figure 4:
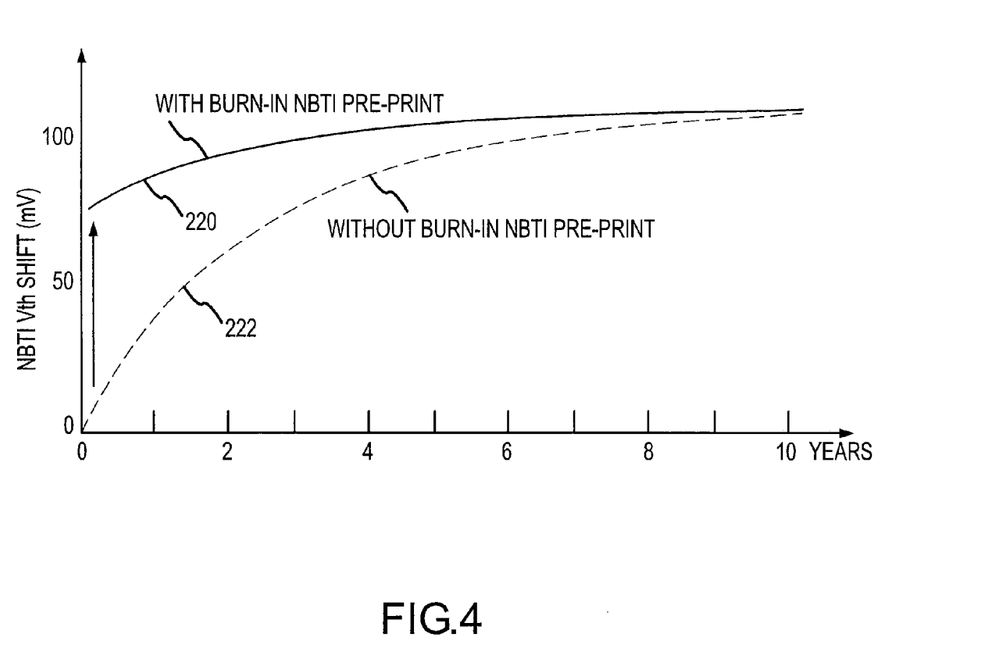
FIG. 4 depicts another graph showing the threshold voltage shift caused by NBTI over the lifetime of a device, for one case without any preconditioning (i.e., NBTI pre-print), and also for another case with a burn-in NBTI pre-print, in accordance with certain embodiments of the present invention.

In a colloquial sense, such preconditioning (i.e., "pre-printing") preferably "uses up" possible NBTI threshold voltage shift evenly, and uses as much of it as possible, preferably during a burn-in test operation where the high voltages and high temperature accelerates the NBTI effect. If, for example, 80% of the threshold shift occurs during burn-in test, then the circuit only has to deal with the remaining 20% of the threshold shift over the rest of the circuit lifetime. This saturation effect is depicted graphically in FIG. 4, which shows a 100 mV possible threshold voltage shift without a burn-in NBTI pre-print (labeled as 222), and also shows in contrast a 30 mV possible threshold voltage shift after using a burn-in NBTI pre-print (labeled as 220) to achieve an initial shift of 70 mV.

The threshold voltage may be evenly shifted in both matching devices by applying equal amounts of negative bias to both devices. This may be done simultaneously, in which a negative bias is applied to both devices at the same time. This may also be done sequentially, in which a negative bias is applied to one device and not to the other, and then applied to the other and not to the one. Such preconditioning may be accomplished without necessarily requiring additional circuitry just for this purpose, and alternately may be accomplished using circuitry whose presence may be solely motivated by this purpose. Exemplary embodiments, showing an example of each, are described below.

Figure 5:
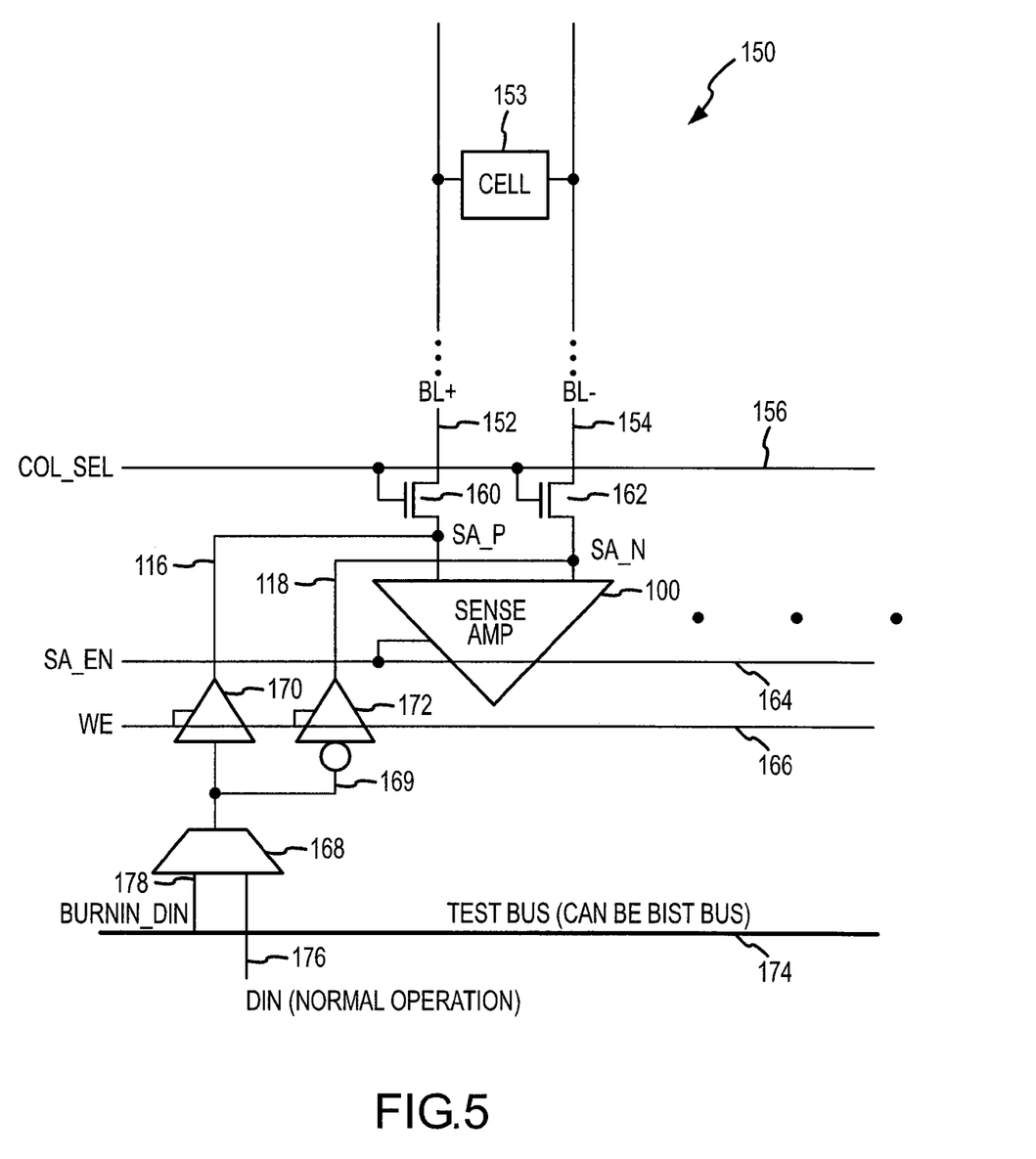
FIG. 5 depicts an exemplary preconditioning circuit which utilizes a test bus to convey during burn-in a data pattern to a sense amplifier circuit.

Referring now to FIG. 5, a circuit configuration 150 is shown in which a complementary pair of bit lines 152, 154 are respectively coupled through select devices 160, 162 to the internal nodes 116, 118 of sense amplifier 100 in response to a column select signal COL_SEL conveyed on node 156. When enabled by the SA_EN signal, the sense amplifier 100 senses and amplifies the differential voltage on the complementary bit lines initially developed by a selected memory cell 153.

Additional circuitry is depicted for writing data into the sense amplifier in response to a write enable signal WE conveyed on node 166, and ultimately into a selected memory cell by way of the selected bit line pair. In normal operation, an input data signal DIN conveyed on node 176 is coupled onto node 169 by multiplexer 168, which is then driven non-inverted by buffer 170 onto the SA_P sense amplifier node 116, and which is inverted and driven by buffer 172 onto the SA_N sense amplifier node 118. During a burn-in test, an input data signal BURNIN_DIN is conveyed on node 178 which is a portion of a test bus 174. The BURNIN_DIN signal 178 is provided to another input of multiplexer 168 and coupled during the test to node 169 and driven onto both sense amplifier nodes as before.

Figure 6:
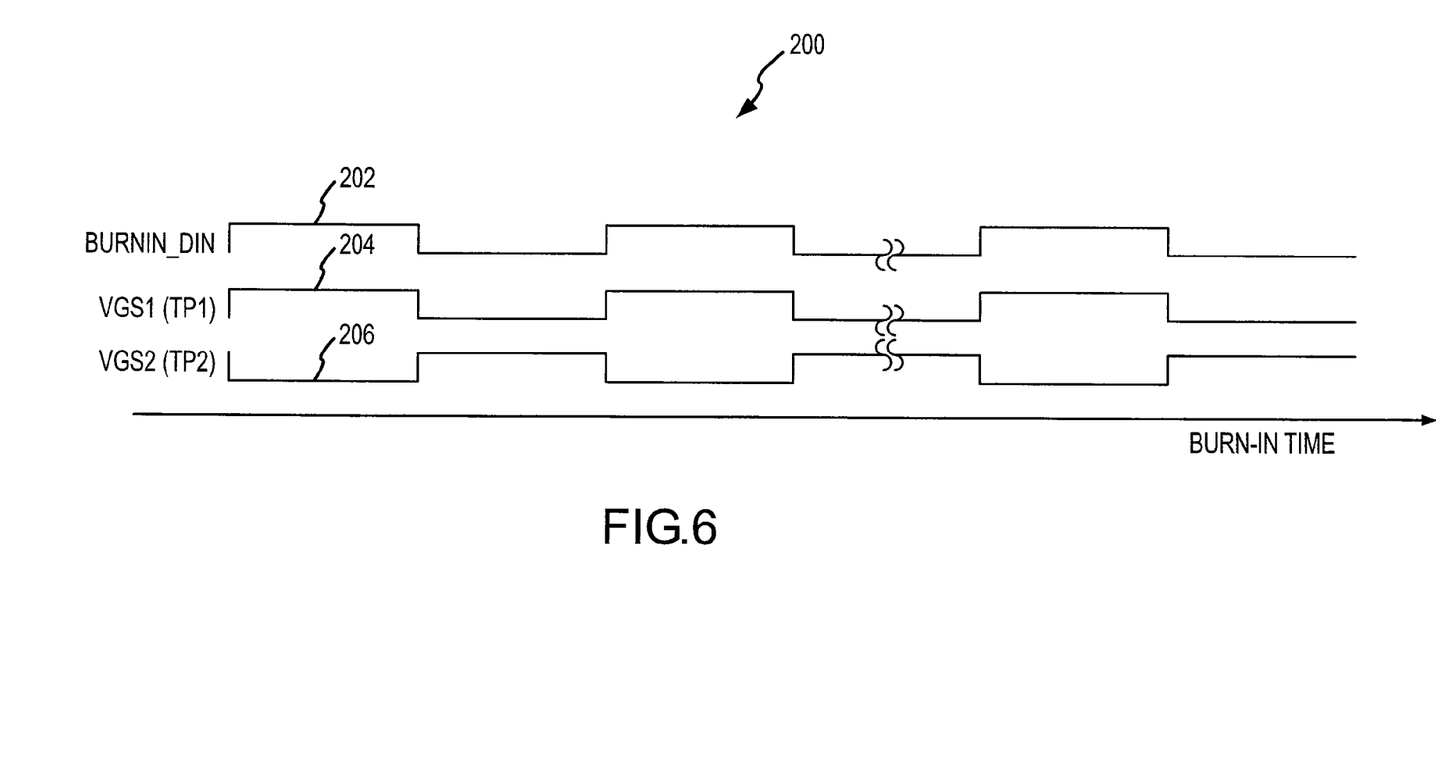
FIG. 6 depicts a waveform diagram illustrating gate bias voltages applied to the PMOS devices within the sense amplifier circuit shown in FIG. 5 for an exemplary burn-in data pattern.

Uniform biasing conditions are provided to both matched devices TP1, TP2 within the sense amplifier 100 by sequentially writing an alternating pattern of 1's and zero's on the BURNIN_DIN signal 178, as depicted in FIG. 6. An alternating sequence of 1's and 0's (labeled as 202) is conveyed on the BURNIN_DIN signal 178, which causes a corresponding sequence of alternating gate-to-source voltage bias conditions (labeled as 204) to be generated on device TP1, and a complementary sequence of alternating gate-to-source voltage bias conditions (labeled as 206) to be generated on device TP2. The SA_EN signal is preferably strobed in the usual fashion to accomplish a write into the sense amplifier, or alternately may be left inactive. When viewed over the duration of the burn-in test, both devices see equal aggregate amounts of negative gate bias sufficient to cause an intentional threshold voltage shift in both devices TP1 and TP2. Such an alternating pattern may be generated internally by test circuitry (not shown) or by externally providing the desired data pattern to the device during burn-in test. Exemplary test circuitry may include counters to toggle the BURNIN_DIN data pattern evenly. Preferably such test circuitry may be incorporated within a built-in self test (BIST) capability, and the test bus 174 preferably used also to provide other built-in self test capabilities.

Figure 7:
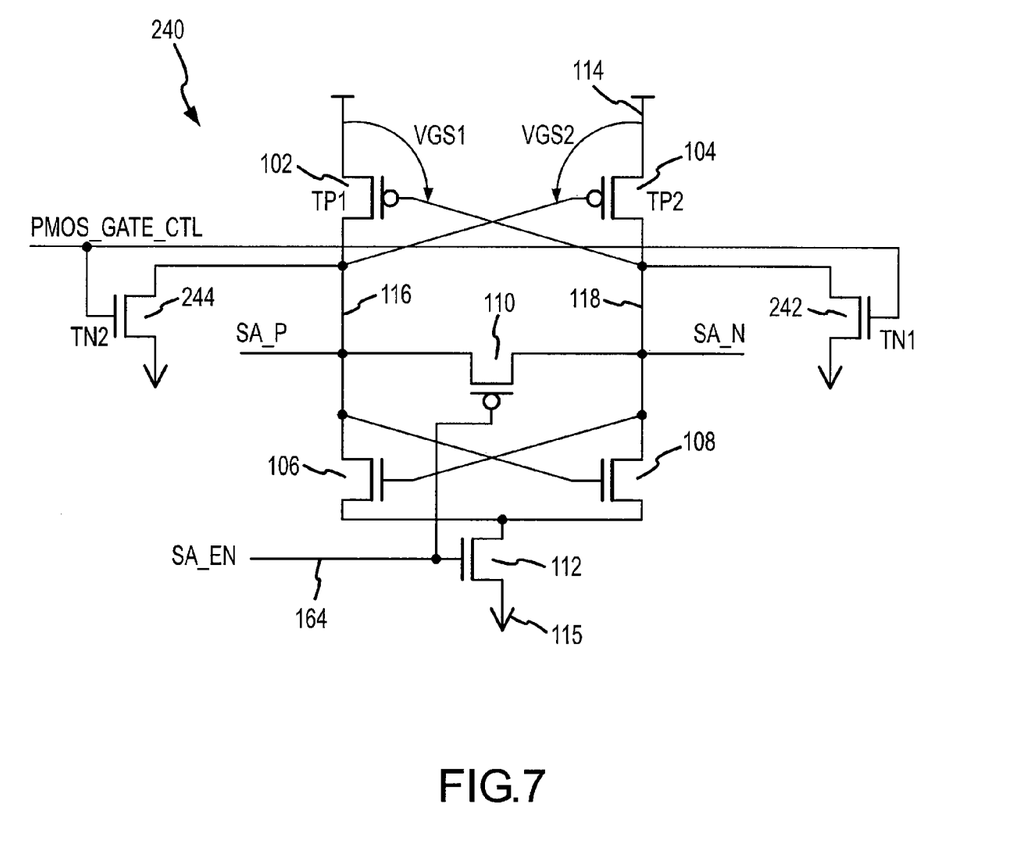
FIG. 7 depicts an exemplary sense amplifier circuit which includes additional transistors to provide a preconditioning gate bias on both PMOS load devices.

Referring now to FIG. 7, a sense amplifier circuit 240 is shown which is similar to that shown in FIG. 1, but which includes biasing devices TN1, TN2 which respectively ground nodes 118, 116 upon an active level on a PMOS_GATE_CTL signal. Uniform NBTI biasing conditions may be provided to both matched devices TP1, TP2 within the sense amplifier 100 by simultaneously grounding both internal sense amplifier nodes 116, 118 in response to the PMOS_GATE_CTL signal. Preferably the SA_EN signal remains inactive during such time the PMOS_GATE_CTL signal is active for any sense amplifier, to reduce power dissipation in the affected sense amplifier. Such a control signal may be generated during a portion of a burn-in test for some sense amplifiers while others are exercised, or may be generated for all sense amplifiers simultaneously.

Figure 8:
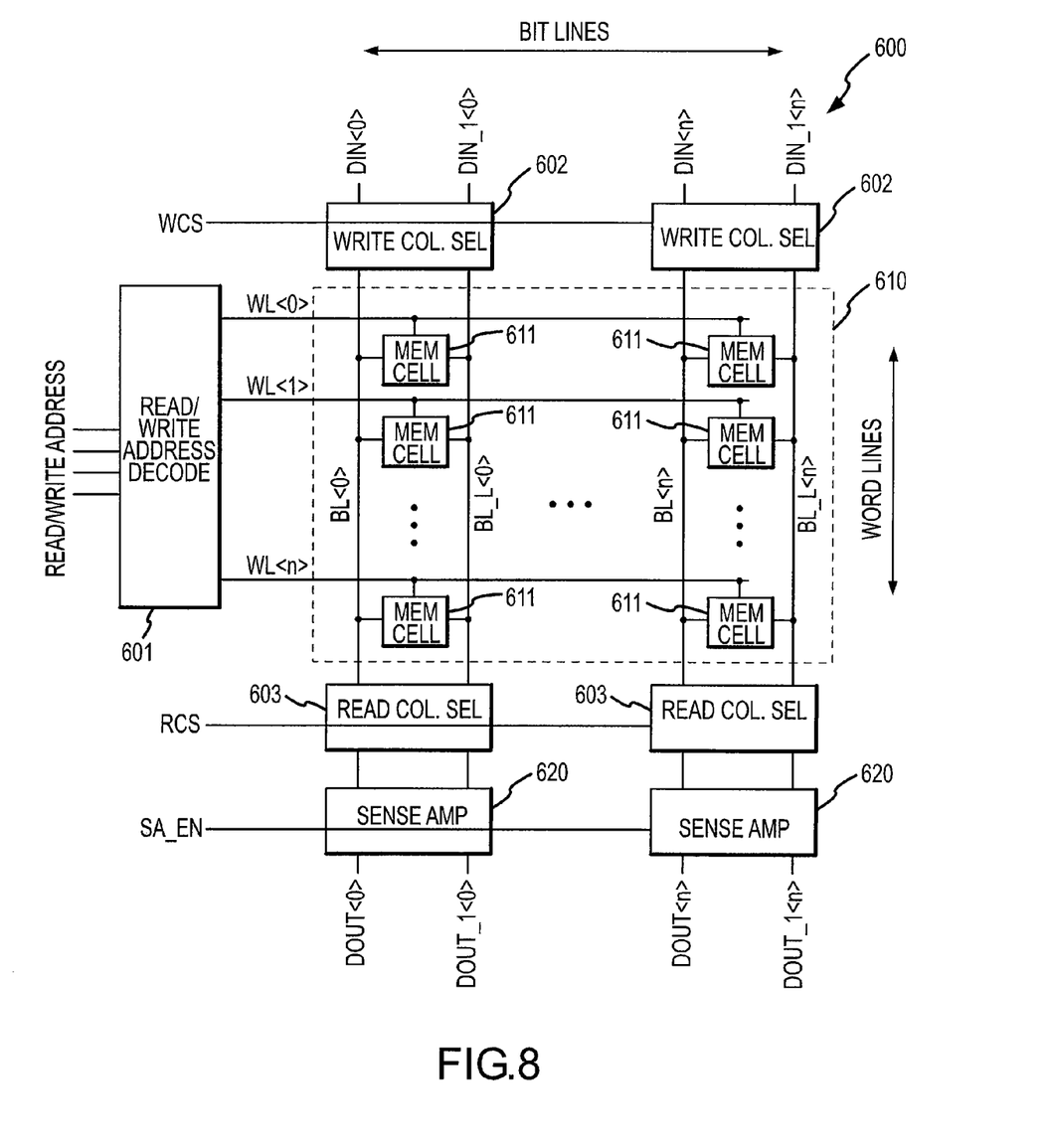
FIG. 8 depicts a block diagram of an integrated circuit including a memory array incorporating sense amplifier circuits which may advantageously utilize preconditioning circuits in accordance with some embodiments of the present invention.

FIG. 8 depicts an illustrative memory circuit 600, which may be largely conventional in design. Address decode logic 601 and column select logic (e.g., write column select logic 602 and read column select logic 603) provide row (or word line) and column select addressing in to an array 610 of memory cells 611. Memory circuit 600 depicts multiple sense amps 620 each corresponding to a column of the array. Operation and timing of each of the depicted sense amps is controlled, at least in part, according to a timing or strobe signal (e.g., timing signal SA_EN). Of course, other suitable array configurations may multiplex a given sense amp across multiple columns and/or incorporate support for other addressing modes, redundant rows or columns, etc.

In general, the sense amps 620 are preferably implemented in accordance with the teachings of the present invention to include provisions for preconditioning matched devices, such as the PMOS load devices. The write column select blocks 602 and the read column select blocks 603 may be implemented at the same end of the bit lines and may be alternately implemented as a write driver circuit coupled directly to one or more sense amplifier nodes (e.g., the internal sense amplifier nodes as described above) and a column select block useful for both read and write modes.

Other structures and methods may be used to compensate for NBTI effects, either alone or in combination with those structures and methods described herein. For example, the aforementioned application entitled "Negative Bias Temperature Instability (NBTI) Hardened Sense Amplifier Circuit and Method Therefor," by Toshinari Takayanagi, filed on even date herewith, describes use of other sense amplifier structures which reduce sensitivity to NBTI effects on circuit performance.

Regarding more general terminology used herein, it will be appreciated by one skilled in the art that any of several expressions may be equally well used when describing the operation of a circuit including the various signals and nodes within the circuit. It may be correct to think of signals (whether logic signals or more general analog signals) being conveyed on wires or buses. For example, one might describe a particular circuit operation as "the output of circuit 10 drives the voltage of node 1 toward VDD, thus asserting the signal OUT conveyed on node 11." Other less formal expressions may also be used to equally describe such a circuit operation, such as "circuit 10 drives node 11 high," "node 11 is brought high by circuit 10," "circuit 10 pulls the OUT signal high" and "circuit 10 drives OUT high." For convenience, an otherwise unnamed or unlabeled node conveying the EQ signal may be referred to as the EQ node. Similarly, phrases such as "pull high," "drive high," and "charge" are generally synonymous unless otherwise distinguished, as are the phrases "pull low," "drive low," and "discharge."

A transistor may be conceptualized as having a control terminal which controls the flow of current between a first current handling terminal (or current carrying terminal) and a second current handling terminal. An appropriate condition on the control terminal causes a current to flow from/to the first current handling terminal and to/from the second current handling terminal (for typical operating voltages of the first and second current handling terminals). Although MOS transistors are frequently discussed as having a drain, a gate, and a source, in many such devices the drain is interchangeable with the source. This is because the layout and semiconductor processing of the transistor is frequently symmetrical. For a P-channel MOS (i.e., PMOS) transistor, the current handling terminal normally residing at the higher voltage is customarily called the source, and the current handling terminal normally residing at the lower voltage is customarily called the drain. A sufficiently low voltage on the gate (relative to the source voltage) causes a current to therefore flow from the source to the drain (provided the respective voltage of the source and drain are different). Consequently, any use herein of a transistor "drain" and "source" terminal (or "drain" and "source" node) should not be taken to necessarily imply that such terminals are not interchangeable.

Regarding power supplies, the colloquial use of phrases such as "tied to VDD" or "connected to VDD" is understood to mean "connected to the VDD node", which is typically then operably connected to actually receive the VDD power supply voltage during use of the integrated circuit. Similar informal phrases may be used with respect to the reference voltage, frequently called "VSS," which is frequently operably connected to a ground reference potential, or just "ground."

Signal labels are arbitrary and will be understood as illustrative, and should not be taken as limiting. While the invention has been described with reference to various embodiments, it will be understood that these embodiments are illustrative and that the scope of the invention is not limited to them. Many variations, modifications, additions, and improvements are possible. For example, while much of the description herein has focused on the illustrative context of NBTI-related $V_t$ shift in PMOS devices of a sense amp, techniques of the present invention may be applied to accommodate other sources of disparate degradation or shift in characteristics of opposing or complementary devices of a differential circuit, or another circuit whose operation is predicated upon well matched devices. Other disparate effects, including other disparate data-dependent effects, channel hot carrier induced effects, and accumulated, persistent or decaying levels disparate effects may all be addressed using techniques of the present invention. Similarly, although cache memory of a processor integrated circuit may profitably employ or exploit techniques of the present invention, other exploitations are also suitable, including other integrated circuits incorporating a memory array.

More generally, realizations in accordance with the present invention have been described in the context of particular embodiments. These embodiments are meant to be illustrative and not limiting. Accordingly, plural instances may be provided for components described herein as a single instance. Boundaries between various components, operations and circuits are somewhat arbitrary, and particular operations are illustrated in the context of specific illustrative configurations. Other allocations of functionality are envisioned and may fall within the scope of claims that follow. For example, in some realizations, aspects of preconditioning biasing may be performed using circuitry, under control of software, or using a combination of circuit and software functionality.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method of compensating for accumulated data-dependent post-manufacture shift in a characteristic of one or more of a pair of matched devices within an integrated circuit, said shift giving rise to a mismatch in the characteristic between the pair of matched devices, the method comprising:
   preconditioning the matched devices to cause an initial shift in the characteristic in each of the matched devices and to thereby reduce an expected magnitude of any further lifetime shift in the characteristic of either matched device.

2. The method, as recited in claim 1, wherein the respective initial shift in each of the matched devices is substantially equal.

3. The method, as recited in claim 1, wherein the respective initial shift in the characteristic in each of the matched devices is greater than the an expected magnitude of any remaining lifetime shift in the characteristic of either matched device.

4. The method, as recited in claim 1, wherein the preconditioning step comprises subjecting each of the matched pair of devices to substantially equal time durations of a predetermined bias condition known to promote the shift in the characteristic.

5. The method, as recited in claim 1, wherein the preconditioning step is carried out at an elevated temperature to promote the shift in the characteristic.

6. The method, as recited in claim 4, wherein:
   the matched devices comprise field effect transistors; and
   the predetermined bias condition includes a negative gate-to-source voltage.

7. The method, as recited in claim 4, wherein the preconditioning step comprises subjecting the matched pair of devices to substantially equal time durations of a first bias condition corresponding to one data state as a second bias condition corresponding to another data state opposite the one data state.

8. The method, as recited in claim 4, wherein the preconditioning step comprises subjecting both matched devices simultaneously to the predetermined bias condition.

9. The method, as recited in claim 5, wherein the preconditioning step is performed during a burn-in operation.

10. The method, as recited in claim 1, wherein the preconditioning step is carried out at an elevated temperature and for a period of time sufficient to cause a respective initial shift in each of the matched devices which are substantially equal in magnitude and greater than the an expected magnitude of any remaining lifetime shift in the characteristic of either matched device.

11. The method, as recited in claim 10, wherein:
   the matched devices form a portion of a sensing circuit of a semiconductor memory; and
   the preconditioning step comprises subjecting the matched pair of devices to substantially equal time durations of a first bias condition corresponding to one data state as a second bias condition corresponding to another data state opposite the one data state.

12. The method, as recited in claim 11, wherein said one data state and said another data state are conveyed serially on a test data bus.

13. The method, as recited in claim 1, wherein:
   the matched devices form a portion of a sensing circuit of a semiconductor memory; and
   the at least one characteristic susceptible to an accumulated data-dependent mismatch results, at least in part, from an effect that disparately affects one of the pair of matched devices as compared with the other, the disparate effect based on a skew in a history of values read out from associated memory elements.

14. The method as recited in claim 13 wherein the disparate effect is associated with negative bias temperature instability.

15. The method as recited in claim 13 wherein the disparate effect involves a monotonic change in the characteristic based on disparate voltage bias histories of the matched devices.

16. The method as recited in claim 15 wherein the characteristic is mobility.

17. The method as recited in claim 15 wherein the characteristic is threshold voltage ($V_t$).

18. The method as recited in claim 13 wherein:
the pair of matched devices comprises PMOS transistors;
the characteristic is threshold voltage ($V_t$); and
the disparate effect is associated with negative bias temperature instability and results in a monotonic increase in $V_t$ based on disparate voltage bias histories of the PMOS transistor devices.

19. The method as recited in claim 18 wherein the pair of matched devices comprises cross-coupled PMOS load devices.

20. The method, as recited in claim 19, wherein the preconditioning step comprises subjecting each of the cross-coupled PMOS load devices to substantially equal time durations of a negative gate-to-source voltage.

21. The method, as recited in claim 20, wherein the preconditioning step comprises individually subjecting each of the cross-coupled PMOS load devices to substantially equal time durations of the negative gate-to-source voltage.

22. The method, as recited in claim 20, wherein the preconditioning step comprises subjecting both cross-coupled PMOS load devices simultaneously to the negative gate-to-source voltage.

23. The method as recited in claim 18 wherein the preconditioning step is performed during a burn-in operation.

24. A circuit comprising:
first and second matched devices which are susceptible to an accumulated data-dependent post-manufacture shift in a characteristic of one or more of the matched devices, said shift giving rise to a mismatch in the characteristic between the matched devices; and
a preconditioning circuit for subjecting the matched devices to a particular condition for a length of time sufficient to cause an initial shift in the characteristic in each of the matched devices and to thereby reduce an expected magnitude of any further lifetime shift in the characteristic of either matched device.

25. The circuit, as recited in claim 24, wherein:
the first and second matched devices together comprise a cross-coupled pair of transistors within a sensing circuit of a semiconductor memory.

26. The circuit, as recited in claim 25, wherein:
the cross-coupled pair of transistors comprise PMOS transistors.

27. The circuit, as recited in claim 24, wherein the preconditioning circuit comprises means for applying a substantially uniform bias history across both first and second matched devices.

28. The circuit, as recited in claim 24, wherein the preconditioning circuit comprises means for subjecting each of the matched devices to substantially equal time durations of a predetermined bias condition known to promote the shift in the characteristic.

29. The circuit, as recited in claim 28, wherein:
the matched devices comprise field effect transistors; and
the predetermined bias condition includes a negative gate-to-source voltage.

30. The circuit, as recited in claim 28, wherein the preconditioning circuit is arranged to subject the matched devices to substantially equal time durations of a first bias condition corresponding to one data state as a second bias condition corresponding to another data state opposite the one data state.

31. The circuit, as recited in claim 30, wherein said one data state and said another data state are conveyed serially on a test data bus.

32. The circuit, as recited in claim 28, wherein the preconditioning circuit is arranged to subject both matched devices simultaneously to the predetermined bias condition.

33. The circuit, as recited in claim 28, wherein the preconditioning circuit is configured to be enabled during a burn-in operation.

34. The circuit, as recited in claim 24, wherein the at least one characteristic susceptible to an accumulated data-dependent mismatch results, at least in part, from an effect that disparately affects one of the pair of matched devices as compared with the other, the disparate effect based on a skew in a history of values read out from associated memory elements.

35. The circuit, as recited in claim 34, wherein the disparate effect is associated with negative bias temperature instability.

36. The circuit, as recited in claim 34, wherein the disparate effect involves a monotonic change in the characteristic based on disparate voltage bias histories of the matched devices.

37. The circuit, as recited in claim 36, wherein the characteristic is mobility.

38. The circuit, as recited in claim 36, wherein the characteristic is threshold voltage ($V_t$).

39. The circuit, as recited in claim 34, wherein:
the matched devices comprise PMOS transistors;
the characteristic is threshold voltage ($V_t$); and
the disparate effect is associated with negative bias temperature instability and results in a monotonic increase in $V_t$ based on disparate voltage bias histories of the PMOS transistor devices.

40. The circuit, as recited in claim 39, wherein the pair of matched devices comprises cross-coupled PMOS load devices within a sensing circuit of a semiconductor memory.

41. The circuit, as recited in claim 40, wherein the preconditioning circuit is configured to subject each of the cross-coupled PMOS load devices to substantially equal time durations of a negative gate-to-source voltage.

42. The circuit, as recited in claim 41, wherein the preconditioning circuit is configured to individually subject each of the cross-coupled PMOS load devices to substantially equal time durations of the negative gate-to-source voltage.

43. The circuit, as recited in claim 41, wherein the preconditioning circuit is configured to subject both cross-coupled PMOS load devices simultaneously to the negative gate-to-source voltage.

44. The circuit, as recited in claim 39, wherein the preconditioning circuit is configured to be enabled during a burn-in operation.

45. The circuit of claim 24 embodied within a sensing circuit of a memory integrated circuit.

46. The circuit of claim 24 embodied within a sensing circuit of a processor integrated circuit including memory or cache.

47. The circuit, as recited in claim 24, embodied as a sensing circuit in computer readable descriptive form suitable for use in design, test, or fabrication of an integrated circuit.

48. An integrated circuit comprising:
memory elements;
a sense amplifier circuit for sensing data stored in associated memory elements, said sense amplifier including first and second matched devices which are susceptible to an accumulated data-dependent post-manufacture shift in a characteristic of one or more of the matched devices, said shift giving rise to a mismatch in the characteristic between the matched devices; and
a preconditioning circuit for subjecting the matched devices to a particular condition for a length of time sufficient to cause an initial shift in the characteristic in each of the matched devices and to thereby reduce an expected magnitude of any further lifetime shift in the characteristic of either matched device.

49. The integrated circuit, as recited in claim 48, wherein:
the first and second matched devices together comprise a cross-coupled pair of transistors within a sensing circuit of a semiconductor memory.

50. The integrated circuit, as recited in claim 49, wherein:
the cross-coupled pair of transistors comprise PMOS transistors.

51. The integrated circuit as recited in claim 48 wherein the at least one characteristic susceptible to an accumulated data-dependent mismatch results, at least in part, from an effect that disparately affects one of the first load devices as compared with the other, the disparate effect based on a skew in a history of values read out from associated memory elements.

52. The integrated circuit as recited in claim 51 wherein the disparate effect is associated with negative bias temperature instability.

53. The integrated circuit as recited in claim 51 wherein
the matched devices are PMOS devices;
the characteristic is threshold voltage ($V_t$); and
the disparate effect involves a monotonic increase in $V_t$ based of disparate voltage bias histories of the PMOS devices.

54. The integrated circuit of claim 48 embodied as a semiconductor memory.

55. The integrated circuit of claim 48 embodied as a processor integrated circuit including memory or cache.

56. A computer readable encoding of a semiconductor integrated circuit design, the computer readable encoding comprising:
one or more media encoding a representation of a memory circuit that includes plural pairs of bit lines, memory cells coupled to respective ones of the bit line pairs;
the one or more media further encoding a representation of a sense amplifier circuit coupled to one or more respective ones of the bit line pairs for sensing data stored in associated memory elements, said sense amplifier circuit including first and second matched devices which are susceptible to an accumulated data-dependent post-manufacture shift in a characteristic of one or more of the matched devices, said shift giving rise to a mismatch in the characteristic between the matched devices; and
the one or more media further encoding a representation of a preconditioning circuit for subjecting the matched devices to a particular condition for a length of time sufficient to cause an initial shift in the characteristic in each of the matched devices and to thereby reduce an expected magnitude of any further lifetime shift in the characteristic of either matched device.

57. The computer readable encoding of claim 56 wherein each of the one or more media are selected from the set of a disk, tape or other magnetic, optical, semiconductor or electronic storage medium and a network, wireline, wireless or other communications medium.

58. The computer readable encoding of claim 56, in combination with one or more respective media readers therefor, wherein the one or more media and respective media readers, when combined, are exercisable to supply an information stream suitable to at least partially define one or more process steps for fabrication of semiconductor integrated circuits in accordance with the encoded design.

* * * * *